(12) United States Patent
Pelissier et al.

(10) Patent No.: US 11,733,740 B2
(45) Date of Patent: Aug. 22, 2023

(54) PORTABLE INFORMATION HANDLING SYSTEM MIDFRAME TO SLIDING FRAME ASSEMBLY

(71) Applicant: Dell Products L.P., Round Rock, TX (US)

(72) Inventors: Gerald Rene Pelissier, Mendham, NJ (US); Kevin M. Turchin, Cedar Park, TX (US); John Trevor Morrison, Round Rock, TX (US); Yung-Fa Cheng, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 62 days.

(21) Appl. No.: 17/158,605

(22) Filed: Jan. 26, 2021

(65) Prior Publication Data

US 2021/0149456 A1    May 20, 2021

Related U.S. Application Data

(62) Division of application No. 16/246,688, filed on Jan. 14, 2019, now Pat. No. 10,928,863.

(51) Int. Cl.
| | |
|---|---|
| *B29C 45/14* | (2006.01) |
| *G06F 1/16* | (2006.01) |
| *E05D 3/06* | (2006.01) |
| G06F 3/041 | (2006.01) |
| B29K 705/00 | (2006.01) |
| B29L 31/22 | (2006.01) |
| H10K 59/00 | (2023.01) |

(52) U.S. Cl.
CPC ............ *G06F 1/1681* (2013.01); *B29C 45/14* (2013.01); *E05D 3/06* (2013.01); *G06F 1/1637* (2013.01); *G06F 1/1656* (2013.01); *B29K 2705/00* (2013.01); *B29L 2031/22* (2013.01); *E05Y 2900/606* (2013.01); *G06F 3/041* (2013.01); *G06F 2203/04102* (2013.01); *H10K 59/00* (2023.02)

(58) Field of Classification Search
CPC .... G06F 1/1652; G06F 1/1637; G06F 1/1656; G06F 1/1681; G06F 2203/04102; G06F 3/041; B29C 45/14; E05D 3/06; B29K 2705/00; H01L 27/323; H01L 27/32; E05Y 2900/606; B29L 2031/22
See application file for complete search history.

(56) References Cited

U.S. PATENT DOCUMENTS

| | | | |
|---|---|---|---|
| 7,558,057 | B1 | 7/2009 | Naksen et al. |
| 8,804,349 | B2 | 8/2014 | Lee et al. |
| 8,971,032 | B2 | 3/2015 | Griffin |
| 9,164,547 | B1 | 10/2015 | Kwon et al. |
| 9,204,565 | B1 | 12/2015 | Lee |

(Continued)

*Primary Examiner* — Monica A Huson
(74) *Attorney, Agent, or Firm* — Zagorin Cave LLP; Robert W. Holland

(57) ABSTRACT

A portable information handling system presents visual images with a flexible display disposed over separate housing portions rotationally coupled by a set of hinges having an opening defined between them. A multi-segmented support couples to the hinges in the opening to dispose a planar surface proximate the flexible display and extend plural parallel members up from the planar support between the hinges, the plural parallel members separating in response to rotation from a flat to a curved orientation.

5 Claims, 6 Drawing Sheets

(56) References Cited

U.S. PATENT DOCUMENTS

| | | | |
|---|---|---|---|
| 9,235,239 | B2 | 1/2016 | van Dijk |
| 9,348,450 | B1 | 5/2016 | Kim |
| 9,506,279 | B2 | 11/2016 | Kauhaniemi |
| 9,557,771 | B2 | 1/2017 | Park |
| 9,603,271 | B2 | 3/2017 | Lee |
| 9,606,583 | B2 | 3/2017 | Ahn et al. |
| 9,684,343 | B2 | 6/2017 | Tazbaz |
| 9,710,033 | B2 | 7/2017 | Yamazaki et al. |
| 9,760,126 | B2 | 9/2017 | Shin |
| 9,798,359 | B2 | 10/2017 | Seo |
| 9,848,502 | B1 | 12/2017 | Chu |
| 9,870,031 | B2 | 1/2018 | Hsu et al. |
| 9,874,048 | B1 | 1/2018 | Hsu |
| 9,874,906 | B1 | 1/2018 | Hsu |
| 9,915,981 | B2 | 3/2018 | Hsu |
| 9,992,888 | B2 | 6/2018 | Moon |
| 10,082,833 | B2 | 9/2018 | Chen |
| 10,082,839 | B1 | 9/2018 | Turchin et al. |
| 10,104,790 | B2 | 10/2018 | Lee |
| 10,111,346 | B2 | 10/2018 | Seo |
| 10,143,098 | B1 | 11/2018 | Lee |
| 10,185,364 | B2 | 1/2019 | Seo et al. |
| 10,209,742 | B2 | 2/2019 | Shin |
| 10,209,743 | B1 | 2/2019 | Hsu |
| 10,231,347 | B2 | 3/2019 | Seo |
| 10,234,904 | B2 | 3/2019 | Jiang |
| 10,234,907 | B2 | 3/2019 | Knoppert |
| 10,244,641 | B2 | 3/2019 | Seo |
| 10,274,996 | B2 | 4/2019 | Lin |
| 10,306,783 | B2 | 5/2019 | Seo |
| 10,321,583 | B2 | 6/2019 | Seo |
| 10,327,346 | B2 | 6/2019 | Zhang |
| 10,365,691 | B2 | 7/2019 | Bae |
| 10,383,239 | B2 | 8/2019 | Lee |
| 10,423,196 | B2 | 9/2019 | Seo |
| 10,433,438 | B2 | 10/2019 | Moon |
| 10,448,521 | B2 | 10/2019 | Seo |
| 10,481,638 | B2 | 11/2019 | Yashizumi |
| 10,487,550 | B2 | 11/2019 | Chu |
| 10,509,441 | B2 | 12/2019 | Wu |
| 10,754,395 | B2 | 8/2020 | Sanchez |
| 2010/0232100 | A1 | 9/2010 | Fukuma |
| 2012/0264489 | A1* | 10/2012 | Choi |
| 2012/0307423 | A1 | 12/2012 | Bohn |
| 2012/0307472 | A1 | 12/2012 | Bohn |
| 2013/0021762 | A1 | 1/2013 | van Dijk et al. |
| 2013/0037228 | A1 | 2/2013 | Verschoor |
| 2013/0070431 | A1 | 3/2013 | Fukuma |
| 2013/0286553 | A1 | 10/2013 | Vanska |
| 2014/0042293 | A1 | 2/2014 | Mok |
| 2014/0111954 | A1 | 4/2014 | Lee |
| 2014/0123436 | A1 | 5/2014 | Griffin et al. |
| 2014/0126133 | A1 | 5/2014 | Griffin |
| 2014/0196253 | A1 | 7/2014 | Kauhaniemi |
| 2014/0226275 | A1* | 8/2014 | Ko .................. G06F 1/1652 361/679.27 |
| 2014/0328041 | A1 | 11/2014 | Rothkopf |
| 2015/0062525 | A1 | 3/2015 | Hirakata |
| 2015/0233162 | A1 | 8/2015 | Lee |
| 2015/0277506 | A1 | 10/2015 | Cheah et al. |
| 2015/0366089 | A1 | 12/2015 | Park et al. |
| 2016/0066454 | A1 | 3/2016 | Hill |
| 2016/0132076 | A1 | 5/2016 | Bitz et al. |
| 2016/0195901 | A1 | 7/2016 | Kauhaniemi |
| 2016/0227645 | A1 | 8/2016 | Hampton |
| 2016/0370828 | A1 | 12/2016 | Hsu |
| 2017/0139442 | A1 | 5/2017 | Yoshizumi |
| 2017/0290179 | A1 | 10/2017 | Zhang |
| 2017/0307929 | A1 | 10/2017 | Nakazawa |
| 2018/0014417 | A1 | 1/2018 | Seo et al. |
| 2018/0059734 | A1 | 3/2018 | Knoppert et al. |
| 2018/0077808 | A1 | 3/2018 | Seo et al. |
| 2018/0095502 | A1 | 4/2018 | Yamazaki |
| 2018/0103550 | A1 | 4/2018 | Seo et al. |
| 2018/0181164 | A1 | 6/2018 | Chen |
| 2018/0188778 | A1 | 7/2018 | Shin |
| 2018/0232011 | A1 | 8/2018 | Jiang et al. |
| 2018/0242466 | A1 | 8/2018 | Lee et al. |
| 2018/0292860 | A1 | 10/2018 | Siddiqui |
| 2018/0324964 | A1 | 11/2018 | Yoo |
| 2018/0347245 | A1 | 12/2018 | Chu |
| 2019/0073002 | A1 | 3/2019 | Wu et al. |
| 2019/0302848 | A1 | 10/2019 | Han |

* cited by examiner

PORTABLE INFORMATION HANDLING SYSTEM MIDFRAME TO SLIDING FRAME ASSEMBLY

CROSS-REFERENCE TO RELATED APPLICATIONS

This application is a divisional of U.S. patent application Ser. No. 16/246,688, filed Jan. 14, 2019, entitled "Portable Information Handling System Midframe to Sliding Frame Assembly," naming Gerald Rene Pelissier, Kevin M. Turchin, John Trevor Morrison, and Yung-Fa Cheng as inventors, which application is incorporated herein by reference in its entirety.

BACKGROUND OF THE INVENTION

Field of the Invention

The present invention relates in general to the field of portable information handling system displays, and more particularly to a portable information handling system midframe to sliding frame assembly.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems are built in portable housing to support mobile operations free from external cables. For example, portable information handling systems typically integrate processing components, a battery and a touchscreen display that presents information as visual images and accepts touches as inputs. Tablet portable information handling systems generally dispose processing components and the battery in a planar housing covered by the touchscreen display. Convertible information handling systems typically have separate planar housing portions rotationally coupled by a hinge to rotate between a closed position and various open positions that accept inputs, such as a clamshell and tablet position. Conventional convertible information handling systems integrate the touchscreen display in one planar housing portion and a keyboard in the other planar housing portion so that an end user can type inputs into the information handling system. Some convertible information handling systems rotate housing portions 360 degrees relative to each other to a tablet position that exposes the touchscreen display on one side and hides the keyboard underneath on the other side.

One type of touchscreen display used in portable information handling systems is an organic light emitting diode (OLED) display, which illuminates colors at pixels by electrical stimulation of an organic material. OLED displays provide a thinner solution than conventional liquid crystal displays (LCDs), which rely upon a backlight to illuminate an image. OLED displays are typically built by disposing a flexible OLED film over a substrate. In a conventional tablet or convertible system, OLED display films are typically disposed over a glass or other stiff substrate to provide a firm surface against which an end user may make touch inputs. Some convertible information handling systems include an OLED display over both rotationally coupled housing portions, in effect replacing the keyboard with a touchscreen display. In such systems, when the housing portions rotate to a clamshell configuration, a keyboard presented at the display accepts typed inputs. When the system rotates 180 degrees to a flat configuration, both display surfaces are available for presenting visual images as tablet. An advantage of this configuration is that a larger tablet display area is available for viewing information, while a closed configuration improves portability. A disadvantage of this configuration is that a seam exists between the two display areas where the hinge rotationally couples the housing portions to each other.

Since OLED films are flexible, mounting an OLED film on a flexible substrate, such as a plastic substrate, allows folding of a display with a hinge about an intersection of housing portions. With a POLED flexible display, the display is disposed over both rotationally coupled housing portions to fold with hinge rotation between closed and open positions. The closed position protects the display and offers reduced size for improved portability. The open position offers a contiguous display area across both housing portions for improved visual image presentation. A difficulty with incorporation of a flexible OLED display in a flexible housing is that the rotation about the hinge has a different degree of motion for the display on the inner circumference of the motion and the housing that supports the display, which resides in a different plane of travel. The "gap" in relative motion has to be accommodated or the flexible display will have waviness introduced with associated poor electrical and optical damage, including likely physical damage.

SUMMARY OF THE INVENTION

Therefore, a need has arisen for a system and method which supports a flexible display in a portable information handling system that transitions between flat and folded configurations.

In accordance with the present invention, a system and method are provided which substantially reduce the disadvantages and problems associated with previous methods and systems that support a flexible display in portable information handling system. A multi-segmented support has a planar surface that rests against and supports a flexible display through changes in orientation. Plural parallel members extend upwards from the planar surface between hinges that rotate information handling system housing portions to form a base that supports the flexible display in a flat orientation and to separate during folding.

More specifically, a portable information handling system processes information with processing components disposed in rotationally coupled housing portions. A flexible display extends over the housing portions as a contiguous surface to present the information as visual images and accept end user touches as inputs. A set of hinges rotationally couple the housing portions with an opening defined between the hinges. For instance, each hinge has an odd number of hinge elements that rotationally interface to rotate the housing portions about an axis defined from a center hinge element. A multi-segmented support is disposed in the opening between the hinges and having a planar surface extending under the hinges to support the flexible display in a curved orientation of the hinge elements. Parallel members extend upward from the planar surface in proximity to each other in a flat orientation to aid in support of the flexible display, such as during touches against the flexible display as inputs to touchscreen. The parallel members spread apart during rotation to a folded orientation to aid portability. A metallic member integrated in the multi-segmented support couples to the hinges to provide lateral stability.

The present invention provides a number of important technical advantages. One example of an important technical advantage is that a portable information handling system folds a flexible display about a hinge with a planar surface of a multi-segmented support having parallel members extending up from the planar surface and separating to adapt to the folded orientation. Upon unfolding to a flat orientation, the parallel members move into proximity of each other providing a solid support of the flexible display against end user touch inputs. A metallic member extending across the multi-segmented support along a central parallel member secures to hinges on opposing sides of the housing portions to provide lateral support against transverse motion of the display that can introduce warpage or other damage to the flexible display.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A multi-segmented support disposed between hinges that rotationally couple information handling system housing portions to each other has a planar surface to support a flexible display with parallel members that separate when transitioned to a folded orientation. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
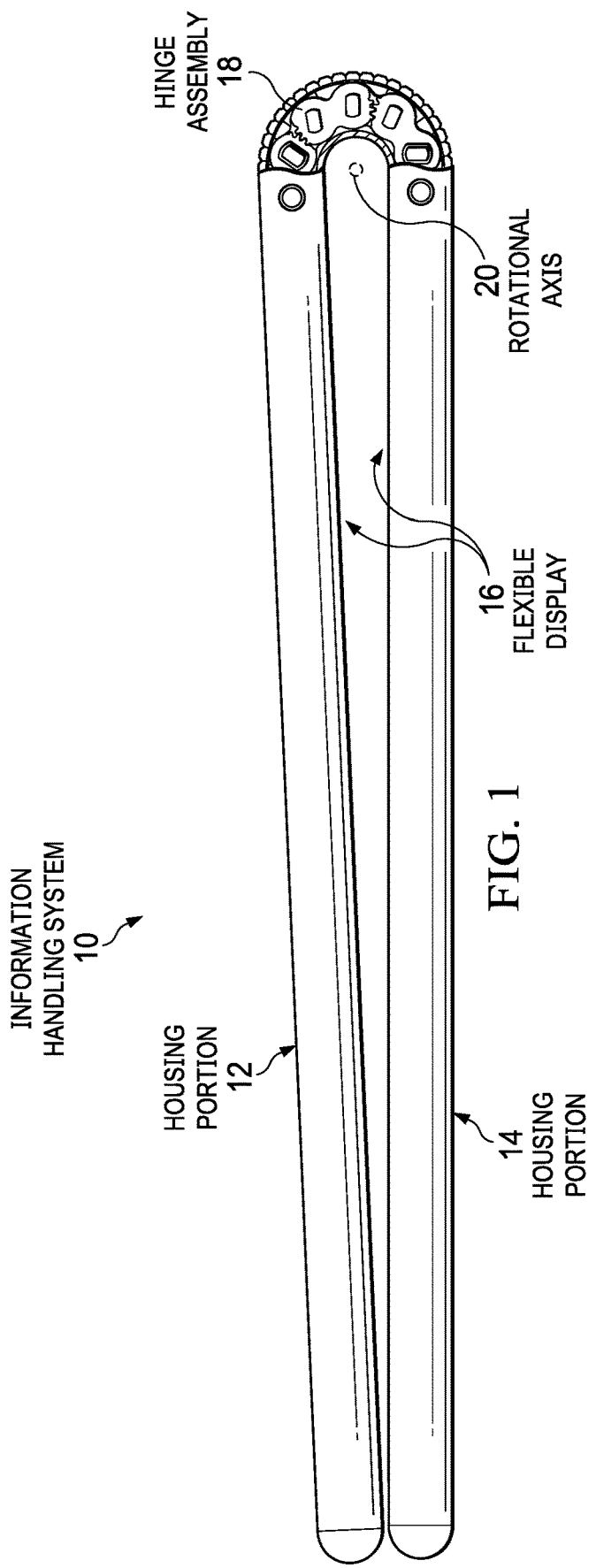
FIG. 1 depicts a side view of a portable information handling system having a flexible display in a folded orientation.

Referring now to FIG. 1, a side view depicts a portable information handling system 10 having a flexible display 16 in a folded orientation. Portable information handling system 10 has a first housing portion 12 that rotates relative to a second housing portion 14 about a hinge assembly 18, which is shown in a cutaway view. Flexible display 16 is, for example, an organic light emitting diode (OLED) display having flexible plastic substrate (POLED). Although POLED displays will fold, sharp folds can lead to damage so that hinge 18 folds POLED flexible display 16 about a rotational axis 20 that does not exceed folding constraints, such as in the example folded orientation of FIG. 1. To maintain a consistent fold diameter about rotational axis 20, hinge 18 cooperates with a multi-segmented support as described below. In addition to maintaining an acceptable display fold constraint, the multi-segmented support rests underneath flexible display 16 when in a flat orientation to resist distortions introduced by finger or stylus touches at the display. Without support from beneath flexible display 16, touches and presses may damage the POLED material if excessive distortion is introduced.

Figure 2:
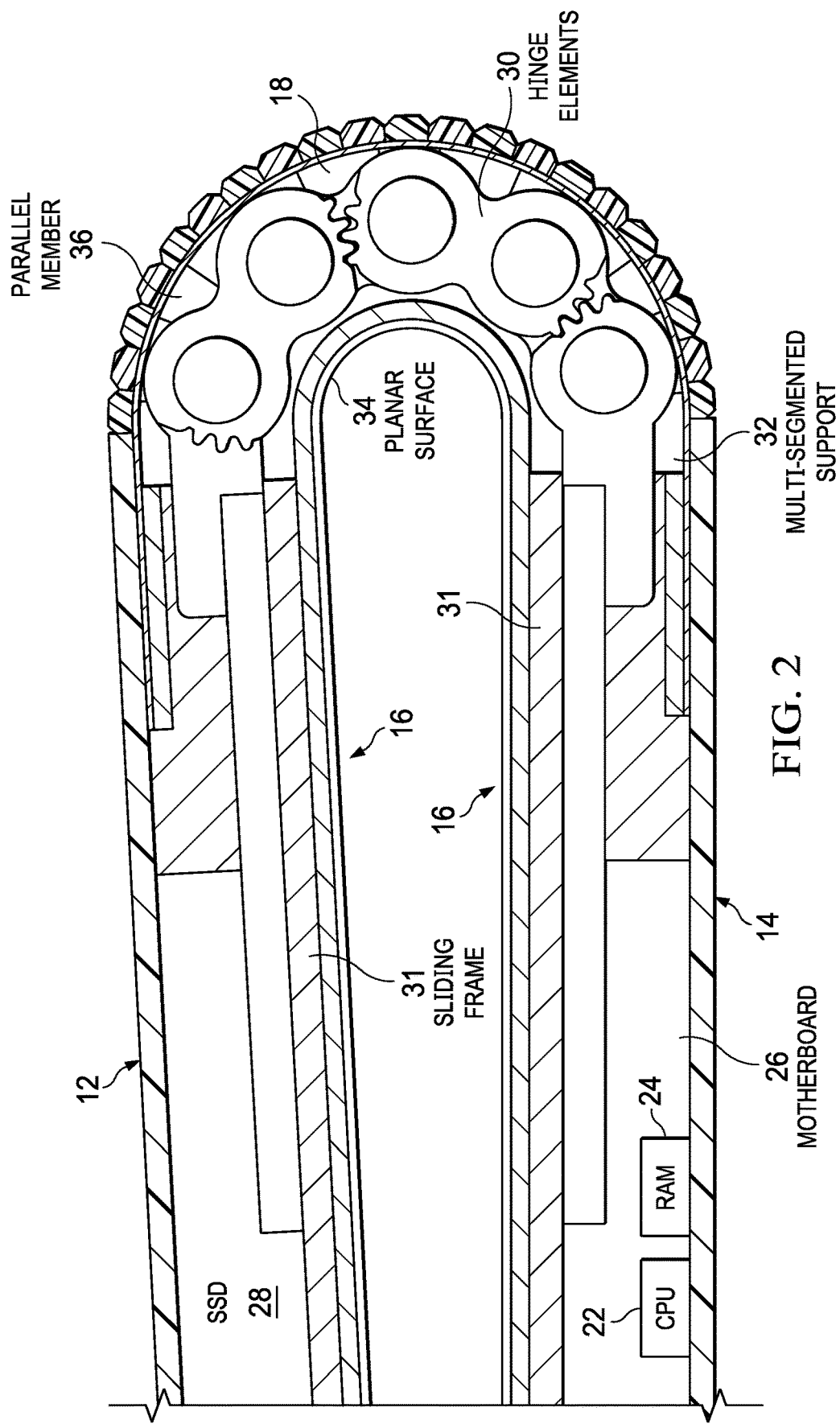
FIG. 2 depicts a side cutaway view of the portable information handling system having the flexible display supported by a multi-segmented support.

Referring now to FIG. 2, a side cutaway view depicts the portable information handling system 10 having the flexible display 16 supported by a multi-segmented support 32. Portable information handling system 10 processes information with processing components disposed in housing portions 12 and 14. In the example embodiment, a central processing unit (CPU) 22 interfaces with a random access memory (RAM) 24 through a motherboard 26 to execute instructions that process information, such as an operating system and applications retrieved from persistent memory of a solid state drive 28. In alternative embodiments, a variety of processing components may be included in housing portions 12 and 14 that cooperate to process information and present the information as visual images at flexible display 16, such as components to manage power, store power, and communicate information.

In the example embodiment, hinge 18 attains an appropriate folded orientation for flexible display 16 with plural rotationally interfaced hinge elements 30. For instance, gears interface each hinge element 30 to coordinate rotation at a desired diameter around rotational axis 20 so that flexible display 16 remains within folding constraints. A sliding frame 31 is disposed in each housing portion 12 and 14 to aid in coordination of folding and unfolding flexible display 16. More specifically, in the example embodiment, flexible display 16 is held in a position centered about hinge 18 so that some relative lateral motion takes place between flexible display 16 and housing portions 12 and 14 during folding and unfolding since the circumference of rotation of flexible display 16 is smaller than that of housing portions 12 and 14. Sliding frames 31 support flexible display 16 as its relative lateral position shifts during folding and unfolding.

Multi-segmented support 32 integrates with hinge 18 to support flexible display 16 in both folded and flat orientations. A planar surface 34, such as a plastic surface having resilience to flex about the desired diameter, is disposed between flexible display 16 and hinge 18 to provide a solid curved surface for flexible display 16 in the folded configuration. Parallel members 36 integrate with planar surface 34 and extend upward and through an opening defined by hinge 18 to rest against a flexible outer cover of information handling system 10. As described in greater detail below, parallel members 36 spread apart as information handling system 10 rotates to the folded orientation.

Figure 3:
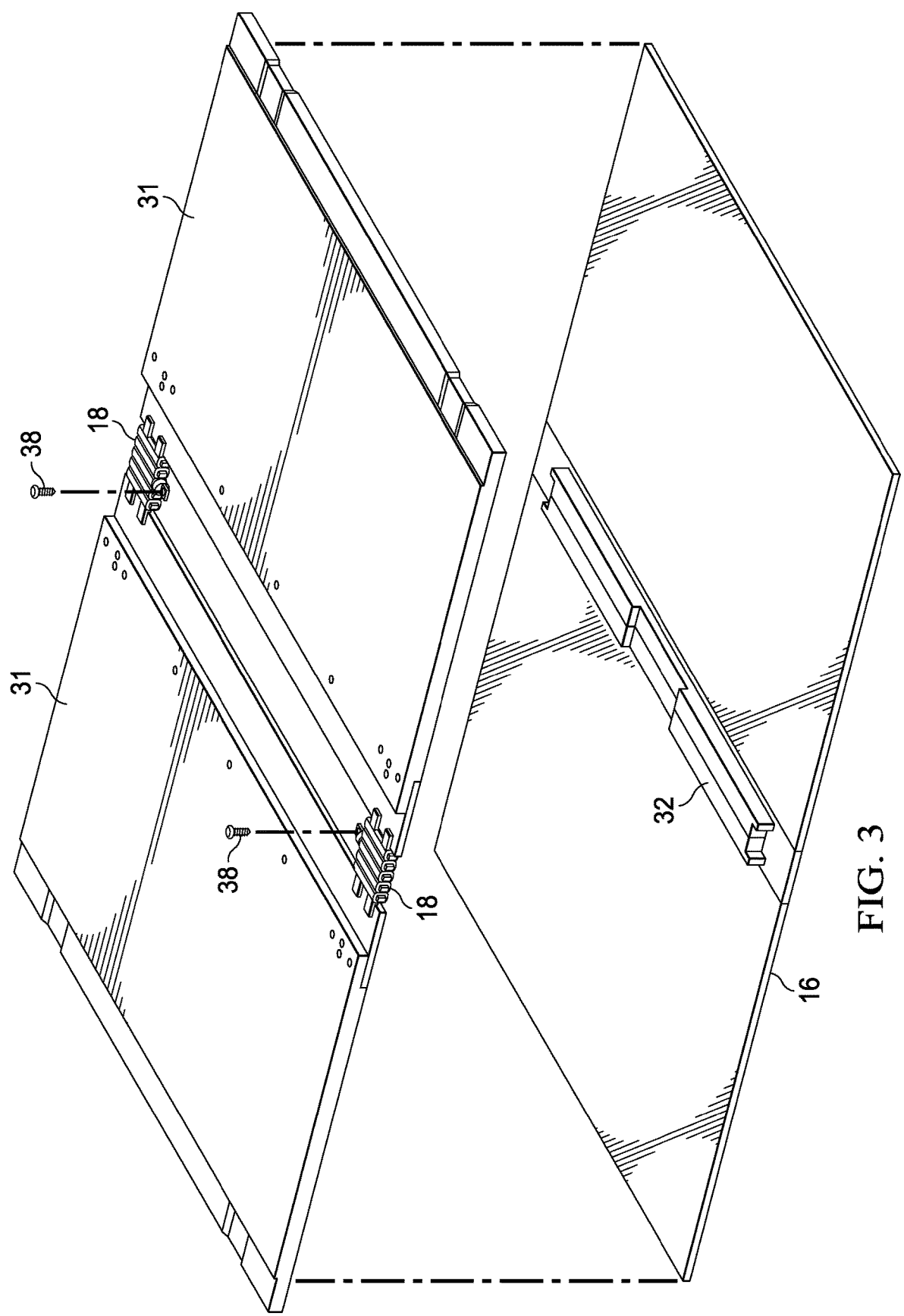
FIG. 3 depicts an exploded view of the flexible display and multi-segmented support aligned to couple to hinges rotationally coupled with a sliding frame assembly.

Referring now to FIG. 3, an exploded view depicts flexible display 16 and multi-segmented support 32 aligned to couple to hinges 18 rotationally coupled with a sliding frame assembly 31. Multi-segmented support 32 fixedly couples to flexible display 16 at a central location aligned to fit in an opening defined between hinges 18 and sliding frames 31. Screws 38 fit through multi-segmented support 32 to couple multi-segmented support 32 and hinges 18. Affixing multi-segmented support 32 to hinges 18 provides a secure attachment that limits lateral forces from stressing flexible display 16 during use of information handling system 10. For instance, if flexible display 16 moves with independence from sliding frames 31, distortions may occur at flexible display 16 from side pushes made at housings 12 and 14. Excessive relative movement may introduce distortions that permanently wrinkle flexible display 16. In alternative embodiments, other types of coupling devices may be used instead of screws, such as a pin, rivet or other type of mechanical coupling device.

Figure 4:
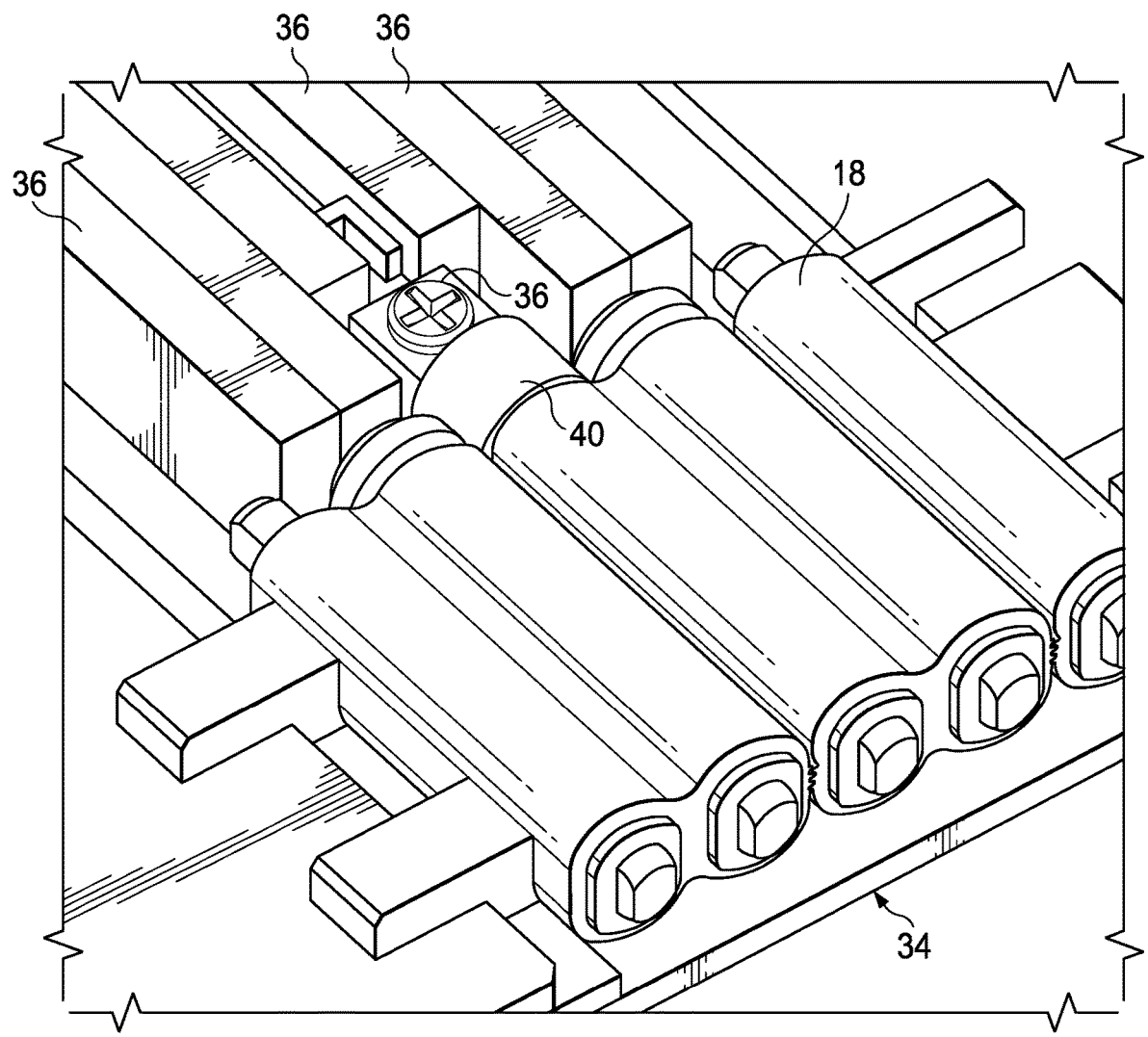
FIG. 4 depicts an upper perspective view of a hinge assembly coupled to the multi-segmented support in a flat orientation.

Referring now to FIG. 4, an upper perspective view depicts a hinge 18 assembly coupled to the multi-segmented support 32 in a flat orientation. Planar surface 34 extends under hinge 18 to provide a smooth surface against flexible display 16 as hinge 18 rotates from the depicted flat orientation to the folded orientation of FIG. 2. Hinge 18 integrates a coupling attachment point 40 through which screw 18 inserts to secure multi-segmented support 32. Parallel members 36 integrate with planar surface 34 and extend across the width of information handling system 10 to couple to a hinge 18 on the opposite side. Parallel members 36 have a height of approximately that of hinge elements 30 so that when information handling system 10 rests on its back surface and presents flexible display 16, the outside surface of parallel members 36 and hinge 18 provide support against a support surface, such as a desktop surface. The support across the folded region between hinges 18 provided by parallel members 18 helps to prevent damage introduced by touches of end user fingers or stylus devices against flexible display 16.

Figure 5:
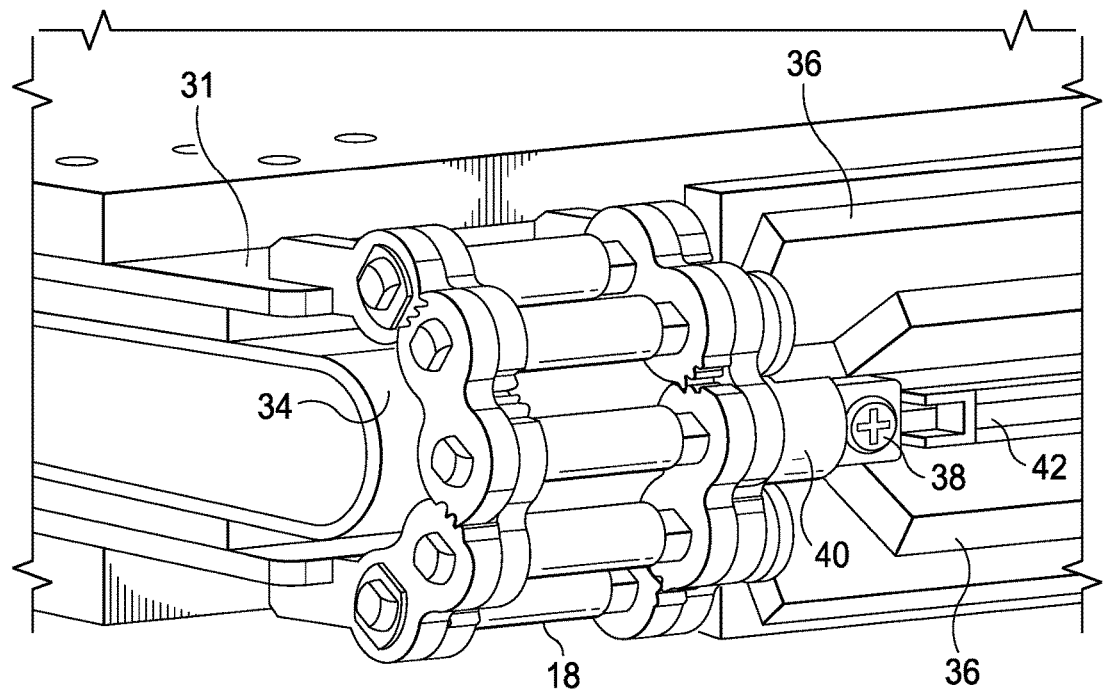
FIG. 5 depicts a side perspective view of the hinge assembly coupled to the multi-segmented support in a curved orientation.

Referring now to FIG. 5, a side perspective view depicts the hinge 18 assembly coupled to multi-segmented support 32 in a curved or folded orientation. Parallel members 36 integrated with planar surface 34 spread out in a radial manner as hinges 18 rotate to space apart distal planar surface 34. In the folded orientation, a metallic member 42 is visible extending from attachment point 40 to the opposing hinge 18. For instance, metallic member 42 is a steel, stainless steel or aluminum piece that extends across the length of multi-segmented support 32 to add strength and limit torsional forces. In one embodiment, metallic member 42 is insert molded to integrate with multi-segmented support 32. Alternatively, other methods of attaching metallic member 42 to multi-segmented support 32 may include an adhesive or other types of bonding. In an alternative embodiment, metallic member 42 is slid into support brackets formed in multi-segmented support 32. In order to provide desired flexibility of planar surface 34, in one embodiment multi-segmented support 32 is injection molded with plastic material to have the folded orientation, such as is depicted in FIG. 5. Injection molding of multi-segmented support 32 in a folded orientation reduces stress on planar surface 34 by compressing the raw form when transitioning from the folded orientation to the flat orientation.

Figure 6:
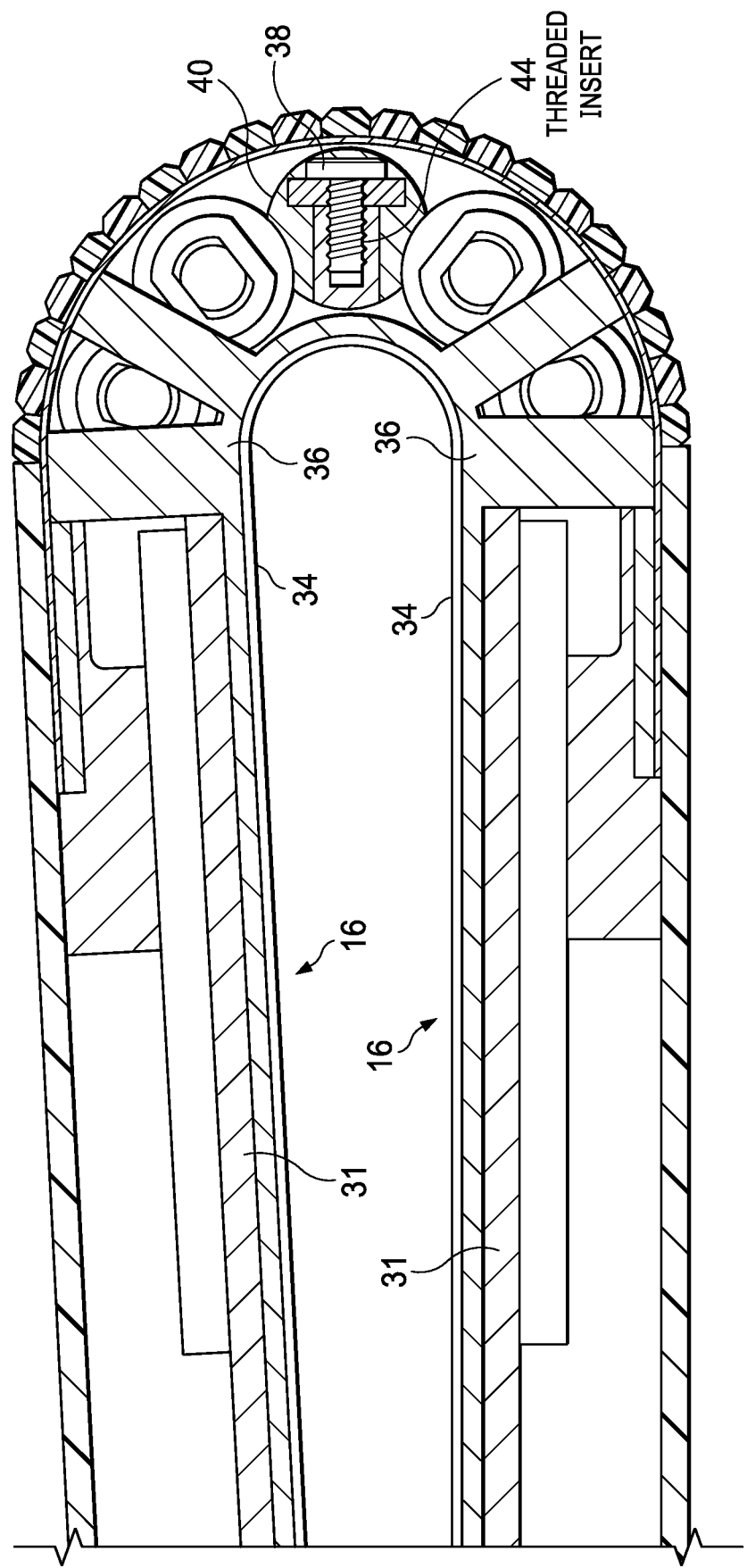
FIG. 6 depicts a side cutaway view of the hinge assembly coupled to the multi-segmented support in the curved orientation.

Referring now to FIG. 6, a side cutaway view depicts the hinge 18 assembly coupled to the multi-segmented support 32 in the curved or folded orientation. Parallel members 36 spread apart at the periphery of information handling system 10 and offer some support against a flexible outer cover. In the example embodiment, metallic member 42 terminates with a threaded insert that accepts screw 38 for a secure attachment. Threaded insert 44 may be integrated in attachment point 40 or inserted as a separate part upon assembly. The example embodiment illustrates that coupling a central hinge element 30 to metallic member 42 at a fixed location relative to planar surface 34 and flexible display 16 anchors the position of flexible display 16 so that sliding frame 31 manages changes in the relative position of flexible display 16 as the orientation shifts from flat to folded. In the example embodiment, hinge 18 includes five rotationally-interfaced hinge elements 30 with the center element in a fixed location relative to flexible display 16. In alternative embodiments, a center element may be defined by including different odd numbers of hinge elements 30, although an even number of hinge elements may also be used.

Figure 7:
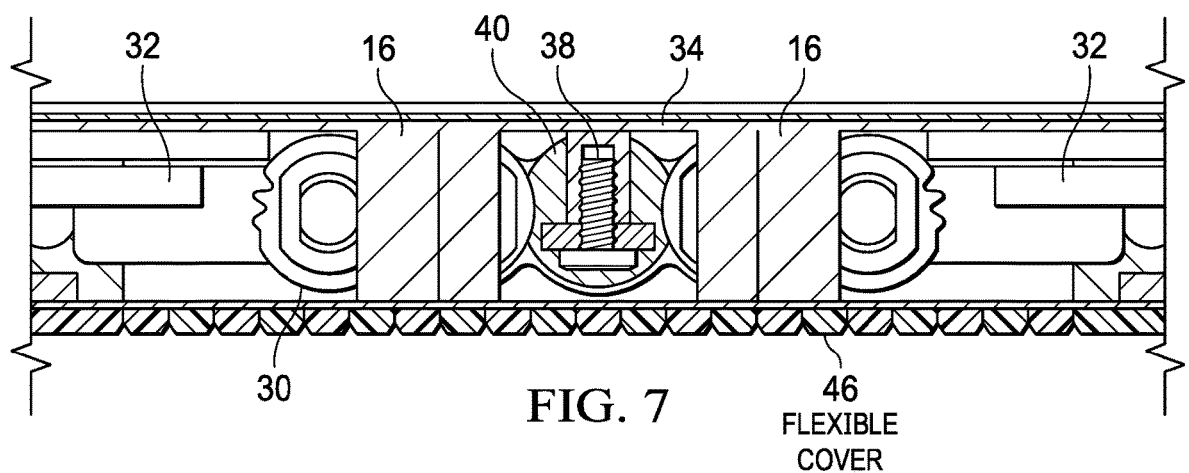
FIG. 7 depicts a side cutaway view of the hinge assembly coupled to the multi-segmented support in the flat orientation.

Referring now to FIG. 7, a side cutaway view depicts the hinge 18 assembly coupled to the multi-segmented support 32 in the flat orientation. At the upper surface of information handling system 10 flexible display 16 is exposed to accept end user touches as inputs. Planar surface 34 is disposed below flexible display 16 to provide immediate support against downward input touches. Parallel members 36 extend downward from planar surface 34 to rest against flexible cover 46 at the bottom surface of information handling system 10. Parallel members 36 thus provide a strong support along the vertical axis to counter downward input presses. In the example embodiment when compared against FIG. 6, flexible display 16 remains in a fixed position relative to the center hinge element 30. Sliding frame 31 has shifted towards hinge 18 in FIG. 7 relative to FIG. 6 in response to the change in the relative length of flexible display 16, which shifts as the inner circumference on which flexible display 16 is located shifts to a planar orientation.

Although the present invention has been described in detail, it should be understood that various changes, substitutions and alterations can be made hereto without departing from the spirit and scope of the invention as defined by the appended claims.

What is claimed is:

1. A method for manufacture of a portable information handling system, the method comprising:
   injection molding a multi-segmented support having a
      planar surface on one side and plural parallel members extending out the opposite side, the multi-segmented support bending about the planar surface;
coupling the planar surface to a flexible display;
coupling each end of the multi-segmented support to a hinge;
insert molding a metallic member through a central portion of the multi-segmented support; and
coupling each hinge to the multi-segmented support with a screw passing through the metallic member.

2. The method of claim 1 wherein each hinge comprises five rotationally-interfaced elements, the screw coupled at a central of the five rotationally interfaced elements.

3. The method of claim 2 further comprising:
rotating the hinge about an axis from a flat orientation to a curved orientation;
conforming the planar surface to the hinge at the curved orientation proximate the axis; and
spreading the parallel members apart from each other on the curved orientation distal the axis.

4. A method for manufacture of a portable information handling system, the method comprising:
injection molding a multi-segmented support having a planar surface on one side and plural parallel members extending out the opposite side, the multi-segmented support bending about the planar surface;
coupling the planar surface to a flexible display; and
coupling each end of the multi-segmented support to a hinge;
wherein injection molding further comprises forming the multi-segmented support with the planar surface in a curved orientation and the parallel members separated from each other.

5. A method for manufacture of a portable information handling system, the method comprising:
injection molding a multi-segmented support having a planar surface on one side and plural parallel members extending out the opposite side, the multi-segmented support bending about the planar surface;
coupling the planar surface to a flexible display;
coupling each end of the multi-segmented support to a hinge;
coupling each hinge to first and second housing portions; and
disposing a sliding frame assembly between each housing portion and the flexible display to support the flexible display during rotation of the hinges.

* * * * *